United States Patent [19]

Kuroki

[11] Patent Number: 4,551,635
[45] Date of Patent: Nov. 5, 1985

[54] CIRCUIT FOR DRIVING THE BASE OF A TRANSISTOR

[75] Inventor: Kazuo Kuroki, Tokyo, Japan

[73] Assignee: Fuji Electric Company, Ltd., Kawasaki, Japan

[21] Appl. No.: 417,205

[22] Filed: Sep. 13, 1982

[51] Int. Cl.$^4$ .......................... H03K 17/60; H03K 3/26
[52] U.S. Cl. ..................................... 307/254; 307/241; 307/270; 307/300
[58] Field of Search ............... 307/270, 300, 254, 255, 307/241

[56] References Cited

U.S. PATENT DOCUMENTS

| | | | |
|---|---|---|---|
| 3,144,563 | 8/1964 | Cohler et al. | 307/300 |
| 3,927,332 | 12/1975 | McKeon et al. | 307/254 |
| 3,959,669 | 5/1976 | Peters | 307/300 |

Primary Examiner—Stanley D. Miller
Assistant Examiner—B. P. Davis
Attorney, Agent, or Firm—Brumbaugh, Graves, Donohue & Raymond

[57] ABSTRACT

Disclosed is an isolation circuit for a power transistor that enables a control circuit to turn the power transistor on and off, while insulating the control circuit from DC currents that may flow to or from the power transistor. The isolation circuit includes a first pulse transformer for receiving a pulse string signal corresponding to an ON command signal from the control circuit to alternatingly energize and de-energize the first pulse transformer. In addition, the isolation circuit includes a fast circuit path comprising a pair of serially connected diodes coupled between the secondary winding of the first pulse transformer and the base resistor of the power transistor for rapidly supplying base current drive to the transistor as soon as the first pulse transformer is energized. Also included in the isolation circuit is a base drive maintaining circuit coupled to the fast circuit path and to the base resistor of the power transistor. The maintaining circuit includes a capacitor that charges while the first pulse transformer is energized and discharges to supply base current drive to the power transistor when the first pulse transformer is de-energized. Furthermore, the isolation circuit includes a second pulse transformer for receiving a pulse signal corresponding to an OFF signal from the control circuit. The secondary winding of the second transformer being coupled to the base drive maintaining circuit for discharging the capacitor and terminating the base current drive to power transistor when the pulse signal corresponding to the OFF signal is received.

5 Claims, 6 Drawing Figures

CIRCUIT FOR DRIVING THE BASE OF A TRANSISTOR

BACKGROUND OF THE INVENTION

This invention relates to a circuit for driving the base of a transistor, and more particularly to a base driving circuit which is small in size and inexpensive to manufacture and will produce a continuous base drive current stably for a power transistor used as an on-off switch for an inverter, for example.

If a power transistor is used as an on-off switch in PWM (pulse width modulation) type inverter, the drive of this power transistor is different from a thyristor operated only by a gate signal, and requires supply of continuous current to the base during conducting (ON). At time of cutoff (OFF), it is required to apply to the base a current in the opposite direction to that during conducting (ON) in order to turn off the power transistor quickly. Thus, in order to cause the power transistor to conduct, it is necessary to supply a continuous current to the base. If a main circuit (for instance, an inverter) including a power transistor is not insulated from a control circuit for driving the base, such a requirement can be easily fulfilled.

In case that the main circuit has to be insulated from the base drive circuit, it is proposed that a pulse transformer is mounted in a base drive circuit. But, such a system requires a high reliability, because it must perform an important role for insulating a signal generated from a control circuit and transmitting it to the base of a power transistor assuredly to drive the base. Since the power transistor can be reduced to low price by the advance of manufacturing technique with the rapid advance to large capacity and high efficiency, a base drive circuit of this kind is also required to be small-sized and inexpensive.

As described before, it is necessary to supply a continuous base current to the power transistor of the main circuit during conducting (ON). FIG. 1 shows a base drive circuit according to a prior art for accomplishing the above. FIG. 2 is a schematic illustration of the waveforms of signals appearing at predetermined portions of the above base drive circuit. The base drive circuit shown in FIG. 1 uses two pulse transformers for ON drive of the base. That is, ON signal of ON-OFF command signals (ref. FIG. 2) obtained in a control circuit in the preceding stage is divided into two high-frequency pulse string signals ($A_1$, $B_1$), which are respectively added to each base of transistors $TR_1$, $TR_2$ for driving a pulse transformer. ON signals appearing at secondary side of ON pulse transformers $T_1$, $T_2$ are rectified by diodes $D_1$, $D_2$ and supplied to the base of a power transistor $TR_3$ as a base current insulated from the control circuit to thereby drive the base. If the power transistor $TR_3$ is cut off (OFF), an OFF pulse transformer $T_3$ is driven by a transistor $TR_4$, and a counter bias is applied to the base of the power transistor $TR_3$ to turn off the power transistor rapidly.

In the base drive circuit of this prior art, when only one of a series of high-frequency pulse string signals is used, the base current is an interrupted wave. So two pulse transformers are used for ON signals to obtain a continuous base current. But in this case, there is a disadvantage of a plural number of pulse transformers resulting in not reduceing the drive portion. Since it adopts a system of dividing a command signal into two high-frequency pulse string signals, insulating same from a control circuit through a pulse transformer, and rectifying same at secondary side by a diode, it has a disadvantage of causing intermissions in the base current after rectification due to a delay time at time of rise of the pulse transformer. Such intermissions of the base current may cause a collector current of the power transistor $TR_3$ to break. Then, it is proposed to inset signal extending means for giving an overlap period between two pulse string signals so as to supply a base current having no breaks while ON signals are added thereto. But this proposal has a difficulty that a control circuit becomes complicated, going against the direction of lowering the price.

SUMMARY OF THE INVENTION

In view of the above disadvantage of the conventional base driving circuit, it is an object of the present invention to provide a base driving circuit which can produce a continuous base driving current stably for driving a power transistor and which is small in size and inexpensive.

In order to accomplish the object of the present invention, a circuit for driving the base of a transistor by supplying a signal from a control circuit to the base in an insulated manner, comprises a pulse transformer drivable by pulse string signals generated during ON operation command, a circuit for supplying a base drive current having no time delay to the secondary side of the pulse transformer while the latter is energized, and a circuit chargeable while the pulse transformer is energized and dischargeable when the pulse transformer is de-energized, to thereby supply the base drive current.

In the above base driving circuit, it is better that the circuit for supplying a base driving current having no time delay comprises a diode connected into the secondary side of the pulse transformer.

In the above base driving circuit, the circuit chargeable while the pulse transformer is energized and dischargeable when the pulse transformer is de-energized, to thereby supply the base drive current, is a circuit system connected into the secondary side of the pulse transformer through a resistor, a condenser terminal and a diode.

Further in addition, in the above base driving circuit, a reset energy supply winding can be connected into a secondary winding of the pulse transformer, the end portion of the supply winding being connected into a branch point of the circuit for supplying a base drive current having no time delay and the circuit dischargeable when the pulse transformer is de-energized, to thereby supply the base drive current through a diode.

In the above base driving circuit, the circuit for supplying a base drive current having no time delay and the circuit dischargeable when the pulse transformer can be de-energized, to thereby supply the base drive current are directly branched off away the secondary winding of the pulse transformer.

DETAILED DESCRIPTION

This invention will now be described as a circuit for driving the base of a transistor by way of a preferred embodiment, with reference to the attached drawings. In the base driving circuit of the present invention shown in FIG. 3, an ON pulse transformer $T_1$ and an OFF pulse transformer $T_2$ are respectively inserted in one circuit. A collector of the transistor $TR_1$ for driving the pulse transformer is connected into one terminal of the primary winding of the ON pulse transformer $T_1$ (the other terminal being connected into a d.c. power source Vcc for driving the pulse transformer). One terminal of the secondary winding is connected into the diode $D_1$, and branched into two paths after passing through the diode $D_1$. One path goes by way of a resistor $R_1$ for limiting a charging current, a connecting terminal and a diode $D_2$ of a condenser C. The other path bypasses the resistor $R_1$, the connecting terminal and the diode $D_2$ of the condenser C, both being connected at an exit end of the diode $D_2$ through a diode $D_3$ again. Both paths join to be connected, and then are connected into the base of the power transistor $TR_2$ in the main circuit through a resistor $R_2$ for limiting a base current. The other terminal of the secondary winding of the ON pulse transformer $T_1$ is directly connected into an emitter of the power transistor $TR_2$.

Figure 1:
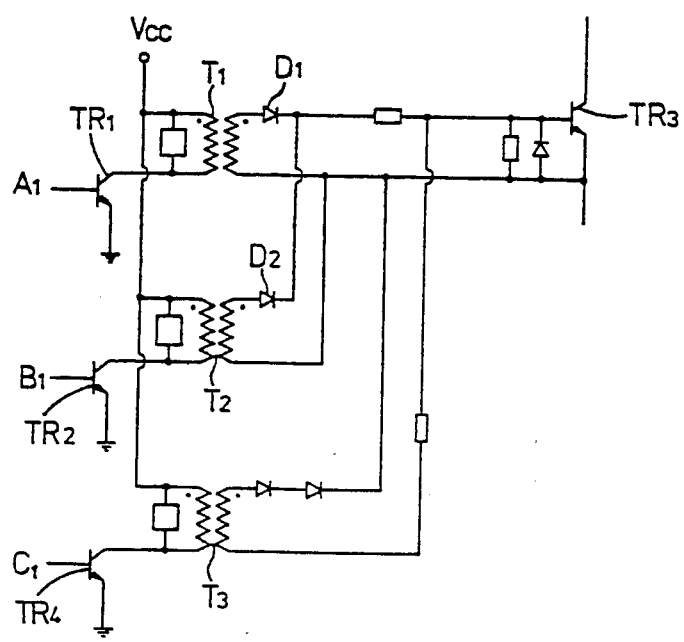
FIG. 1 is a circuit diagram of a conventional circuit for driving the base of a transistor.
Figure 2:
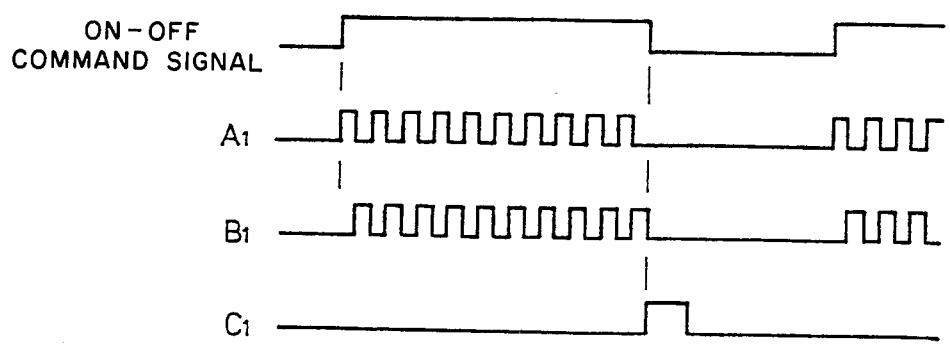
FIG. 2 is a view showing the waveforms of signals appearing at portions of the drive circuit shown in FIG. 1.
Figure 3:
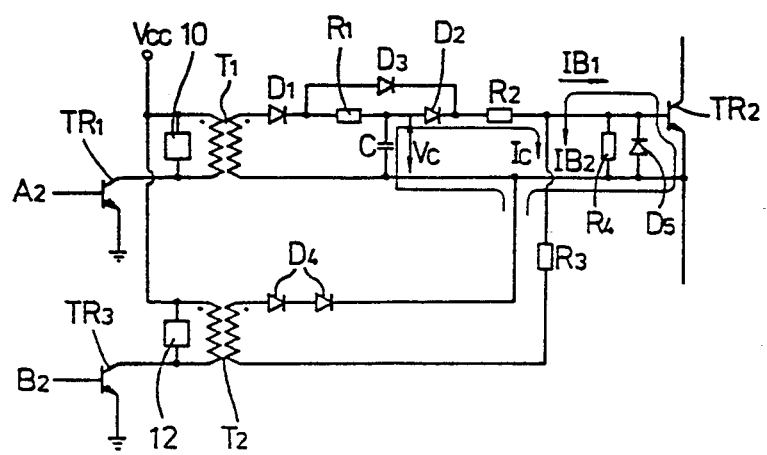
FIG. 3 is a circuit diagram of a transistor base driving circuit according to the present invention.

Concerning a circuit system for processing OFF signal, one terminal of the secondary winding of the OFF pulse transformer $T_2$ driven by the transistor $TR_3$ is connected into the emitter of the power transistor $TR_2$ through a shunt suppression diode $D_4$ (this is also adapted to rectify the OFF signal), and the other terminal of the secondary winding is connected into the base of the power transistor $TR_2$ through a resistor $R_3$ for limiting a counter bias current. In FIG. 3, elements inserted in parallel with the base and emitter of the power transistor $TR_2$ are a diode $D_5$ and a bias resistor, the numerals 10, 12 showing circuits for suppressing the reset voltage.

Figure 4:
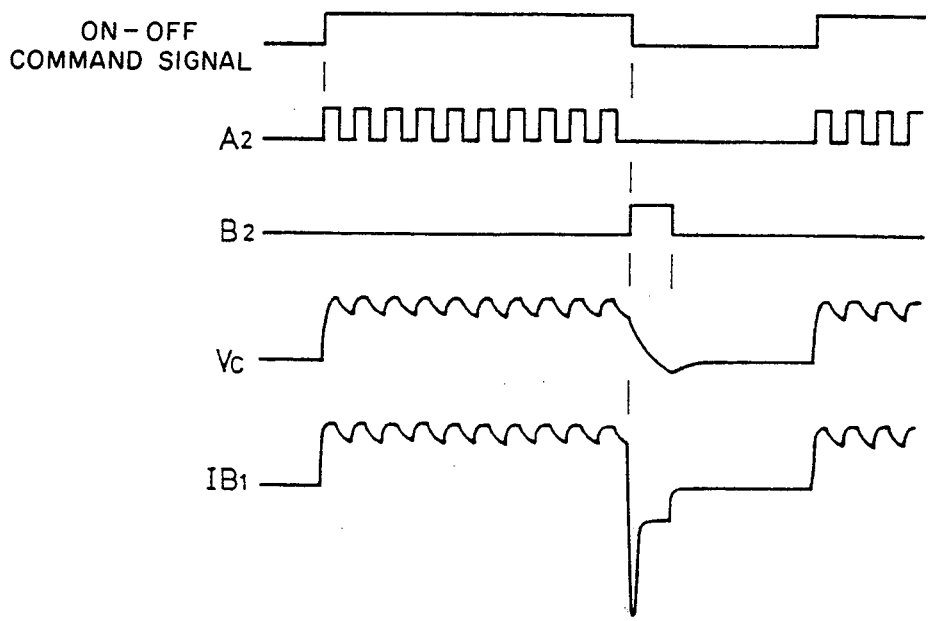
FIG. 4 is a view illustrative of the waveforms of signals appearing at portions of the driving circuit shown in FIG. 3.

By such an arrangement, an ON command signal (ref. FIG. 4) is given to a pulse generator not illustrated to generate one high-frequency pulse string signal $A_2$ to be added to the base of the transistor $TR_1$. When the level of the pulse string signal $A_2$ becomes high, the transistor $TR_1$ conducts to drive the ON pulse transformer $T_1$, and an ON signal generated at the secondary side of this pulse transformer $T_1$ is rectified by the diode $D_1$ and is supplied to the base of the power transistor $TR_2$ as a rapid rise base current $I_{B1}$ through the diode $D_3$ and the resistor $R_2$ for suppressing a current to turn on the power transistor $TR_2$. Simultaneously a charge is applied to a condenser C through the resistor $R_1$ for limiting a charging current.

Subsequently, when the level of the pulse string signal $A_2$ becomes low and the transistor $TR_1$ is cut off, the diodes $D_1$ and $D_3$ are cut off from conducting, but the diode $D_2$ conducts because the condenser C is charged. Accordingly, a discharge current generated from the condenser C is supplied to the base of the power transistor $TR_2$ through the diode $D_2$ and the resistor $R_2$ for limiting a base current, and the power transistor $TR_2$ is retained "ON". This discharge causes the voltage Vc of the condenser C to be lowered (ref. FIG. 4) That is, by the repetition of such an operation, the voltage Vc and base current $I_{B1}$ of the condenser forms a continuous waveform including ripple as shown in FIG. 4, so that the power transistor $TR_2$ is retained "ON".

In order to cut off the power transistor $TR_2$, the supply of pulse string signal $A_2$ based upon an ON signal is stopped, and simultaneously OFF pulse string signal $B_2$ is supplied to the base of the transistor $TR_3$ for driving the OFF pulse transformer $T_2$. Whereupon, OFF signal appears at the secondary side of the pulse transformer $T_2$, which is rectified by the diode $D_4$ having a shunt suppression funtion and added to the emitter of the power transistor $TR_2$. This causes a sharp counter bias current $I_{B2}$ to flow from the emitter to the base, resulting in cutting off the power transistor $TR_2$. In this case, it is desirable that the resistance of a resistor $R_3$ for limiting a counter bias current is set enough smaller than that of the resistor $R_2$ for limiting a base current in such a manner as to cut off the power transistor $TR_2$ quickly. The electric charge remaining in the condenser C discharges as a discharging current Ic, so that the voltage Vc of the condenser C is clipped as shown in FIG. 4.

Figure 5:
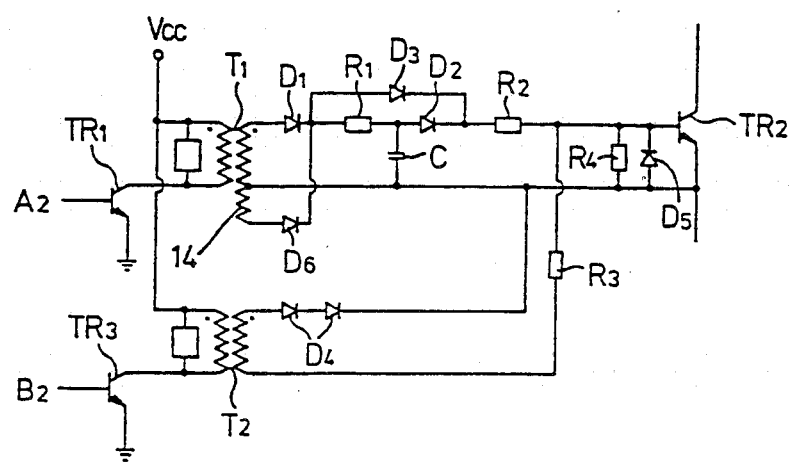
FIG. 5 is a circuit diagram showing a modification of the circuit according to the present invention shown in FIG. 3.

FIG. 5 shows a modified form of the base driving circuit according to the present invention shown in FIG. 3. A reset energy supply winding 14 is added to the secondary winding of the ON pulse transformer $T_1$, whereby the energy at time of resetting the pulse transformer $T_1$ can be supplied to the base of the power transistor $TR_2$ through a diode $D_6$. Thus, the electrostatic capacity of the condenser C can be selected small and reduced to small size, and besides the capacity of the power source Vcc supplied to the pulse transformer can be set small.

Figure 6:
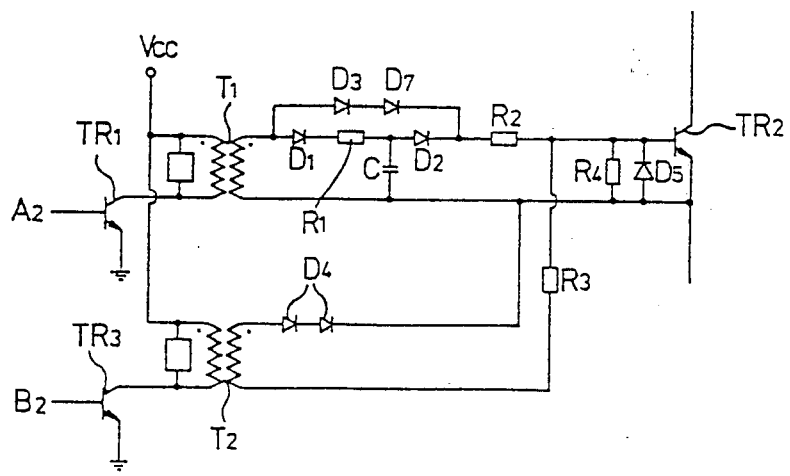
FIG. 6 is a circuit diagram showing a modification of the circuit according to the present invention shown in FIG. 3.

FIG. 6 shows another modified form of the base driving circuit according to the present invention shown in FIG. 3, where one end of the secondary winding of the ON pulse transformer is diverged into two branch paths in a different manner from FIG. 3. That is, in the base driving circuit of FIG. 3, as the divergence of two paths is made after the diode $D_1$, it is obliged to feed to the diode $D_1$ current corresponding to the sum of the current flowing through the diode $D_5$ and the current charging the condenser C through the resistor $R_1$ while the driving transistor $TR_1$ conducts. In the drive circuit of FIG. 6, since the path of the secondary winding is branched on this side of the diode $D_1$, and a path passing through the diodes $D_3$ and $D_7$ is separated from a path passing through the diode $D_1$, the resistor $R_1$ and the terminal and diode $D_2$ of the condenser C, it has an advantage of substantially equalizing the load on each diode.

According to the base driving circuit of the present invention, since one high-frequency pulse string signal $A_2$ is given to the driving transistor to drive one ON pulse transformer during the conducting (ON) command period and the ON signal appearing at the secondary winding is always a continuous base current, ON-OFF control can be stably accomplished in the power transistor of the main circuit. Besides, though conventionally two ON pulse transformers are required, one transformer is quite enough in this circuit, which is extremely advantageous in respect of reduction of size and cost. Corresponding to such a circumstance, other advantages include that a pulse alloting circuit installed in a control circuit can be simplified. In this invention, if such a low-frequency driving that cutoff (OFF) time of the power transistor matters little, it is not necessary to include an OFF pulse transformer $T_2$.

The transistor base driving circuit of the present invention has been described by way of preferred embodiments. The preferred embodiments described herein are not restrictive, and the invention may be improved and altered within the scope of the spirit thereof.

I claim:

1. A circuit for driving the base of a transistor by supplying a signal from a control circuit to the base in an insulating manner comprising:

a first pulse transformer having a primary winding and a secondary winding, the first transformer being responsive to a pulse string signal corresponding to an ON signal from the control circuit applied to its primary winding for alternatingly being energized and de-energized;

first circuit means coupled to the secondary winding for rapidly supplying a base drive current to the transistor while the first pulse transformer is energized;

second circuit means, including capacitor means and means for charging the capacitor means while the first pulse transformer is energized, coupled to first circuit means and supplying base current drive to the transistor when the capacitor means is charged and the first pulse transformer is de-energized; and third circuit means including a second pulse transformer having a primary winding and a secondary winding, the second transformer being responsive to a pulse signal corresponding to an OFF signal from the control circuit applied to its primary winding for being energized, the secondary winding of the second transformer being coupled to the second circuit through one or more diodes for discharging the capacitor means and terminating the base current drive to the transistor when the second transformer is energized.

2. The circuit for driving the base of the transistor according to claim 1, wherein the first circuit means includes first and second serially connected diodes coupled between one end of the secondary winding of the first pulse transformer and a base resistor of the transistor, the other end of the secondary winding of the first transformer being connected to an emitter of the transistor.

3. The circuit for driving the base of a transistor according to claim 2, wherein the second circuit means includes a first resistor coupled between the juncture of the first and second serially connected diodes and a condenser terminal, a third diode coupled between the condenser terminal and the base resistor, and a capacitor coupled between the condenser terminal and the other end of the secondary winding of the first transformer.

4. The circuit for driving the base of a transistor according to claim 2, wherein the circuit further includes a reset energy supply winding having a first and a second end, the first end of the reset energy supply winding being connected to the other end of the secondary winding of the first pulse transformer, the second end of the reset energy supply winding being coupled through another diode to the juncture of the first and second serially connected diodes of the first circuit means for supplying a base drive current to the transistor when the first pulse transformer is reset.

5. The circuit for driving the base of a transistor according to claim 2, wherein the second circuit means includes a further diode coupled between the one end of the secondary winding of the first transformer and a first node, a first resistor coupled between the first node and a condenser terminal and the base resistor and wherein the capacitor means is coupled between the condenser terminal and the other end of the secondary windings of the first transformer.

* * * * *